US011626390B1

(12) United States Patent
Ouderkirk et al.

(10) Patent No.: US 11,626,390 B1
(45) Date of Patent: Apr. 11, 2023

(54) DISPLAY DEVICES AND METHODS OF MAKING THE SAME

(71) Applicant: META PLATFORMS TECHNOLOGIES, LLC, Menlo Park, CA (US)

(72) Inventors: Andrew John Ouderkirk, Kirkland, WA (US); James Ronald Bonar, Redmond, WA (US); Jasmine Soria Sears, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 43 days.

(21) Appl. No.: 17/403,697

(22) Filed: Aug. 16, 2021

Related U.S. Application Data

(63) Continuation of application No. 16/785,258, filed on Feb. 7, 2020, now Pat. No. 11,145,631, which is a continuation-in-part of application No. 16/530,678, filed on Aug. 2, 2019, now Pat. No. 10,921,499, which is a continuation-in-part of application No.
(Continued)

(51) Int. Cl.
*H01L 25/075* (2006.01)
*H01L 33/62* (2010.01)
*H01L 25/16* (2006.01)

(52) U.S. Cl.
CPC ........ *H01L 25/0753* (2013.01); *H01L 25/167* (2013.01); *H01L 33/62* (2013.01); *H01L 2933/0066* (2013.01)

(58) Field of Classification Search
CPC ... H01L 25/0753; H01L 33/62; H01L 25/167; H01L 2933/0066
See application file for complete search history.

(56) References Cited

U.S. PATENT DOCUMENTS

| 3,520,150 | A | 7/1970 | McNeely et al. | |
|---|---|---|---|---|
| 10,453,828 | B1 * | 10/2019 | Ouderkirk | ............. G06F 3/0346 |
| 10,854,583 | B1 * | 12/2020 | Ouderkirk | ............. H01L 27/156 |

(Continued)

OTHER PUBLICATIONS

Anonymous, "Pulse-Amplitude-Modulation Drive Control of LEDs," Jul. 2, 2002, ip.com Journal, ip.com Inc, West Henrietta, NY, XP013003659, 13 pages.
(Continued)

*Primary Examiner* — Victor A Mandala
(74) *Attorney, Agent, or Firm* — Morgan, Lewis & Bockius LLP

(57) ABSTRACT

A display device includes a display panel having a first emission region and a second emission region that surrounds the first emission region. The display device includes a first plurality of light emitters arranged in the first emission region, a plurality of activation lines for the first emission region, a second plurality of light emitters arranged in the second emission region, and a plurality of activation lines for the second emission region. A single activation line of the plurality of activation lines for the first emission region is electrically coupled with a first number of light emitters in the first emission region and a single activation line of the plurality of activation lines for the second emission region is electrically coupled with a second number, distinct from the first number, of light emitters in the second emission region.

20 Claims, 11 Drawing Sheets

Related U.S. Application Data

16/006,734, filed on Jun. 12, 2018, now Pat. No. 10,453,828.

(60) Provisional application No. 62/804,105, filed on Feb. 11, 2019, provisional application No. 62/804,108, filed on Feb. 11, 2019.

(56) References Cited

U.S. PATENT DOCUMENTS

| | | | |
|---|---|---|---|
| 10,930,216 B2* | 2/2021 | Yi | G09G 3/3275 |
| 2003/0210222 A1 | 11/2003 | Ogiwara et al. | |
| 2007/0101927 A1 | 5/2007 | Keyser et al. | |
| 2008/0297604 A1 | 12/2008 | Imai et al. | |
| 2009/0294921 A1 | 12/2009 | Grillberger et al. | |
| 2013/0063557 A1 | 3/2013 | Saigo et al. | |
| 2015/0116388 A1 | 4/2015 | Asanuma et al. | |
| 2017/0103697 A1 | 4/2017 | Kawashima et al. | |
| 2017/0133638 A1 | 5/2017 | Takahashi et al. | |
| 2017/0207105 A1 | 7/2017 | Kasai et al. | |
| 2017/0210953 A1 | 7/2017 | Bernt et al. | |
| 2017/0285344 A1 | 10/2017 | Benko et al. | |
| 2017/0290098 A1 | 10/2017 | Kautzsch et al. | |
| 2018/0045385 A1 | 2/2018 | Tyukhova et al. | |
| 2018/0047325 A1 | 2/2018 | Biwa et al. | |
| 2018/0137602 A1 | 5/2018 | Spitzer et al. | |
| 2018/0190190 A1* | 7/2018 | Xi | G09G 3/3225 |
| 2018/0269266 A1 | 9/2018 | Cancel Olmo et al. | |
| 2018/0335668 A1 | 11/2018 | Fan et al. | |
| 2018/0342572 A1* | 11/2018 | Park | H01L 27/3276 |
| 2019/0005915 A1* | 1/2019 | Liu | G02F 1/136286 |
| 2019/0109184 A1* | 4/2019 | Li | H01L 27/3248 |
| 2019/0164954 A1* | 5/2019 | Yang | H01L 27/3276 |
| 2020/0006457 A1* | 1/2020 | Gu | H01L 27/3276 |
| 2020/0052045 A1* | 2/2020 | Kuo | H01L 27/3211 |
| 2020/0052052 A1* | 2/2020 | Nishimura | H01L 51/0004 |
| 2020/0132997 A1* | 4/2020 | Ouderkirk | H01L 25/0753 |
| 2020/0170126 A1* | 5/2020 | Ahn | G06F 1/1637 |
| 2020/0227488 A1* | 7/2020 | Xin | H01L 27/3216 |
| 2020/0335043 A1* | 10/2020 | Zhao | G09G 3/3225 |
| 2021/0201802 A1* | 7/2021 | Yi | G09G 3/3233 |
| 2021/0248945 A1* | 8/2021 | Liu | H04N 5/2257 |
| 2021/0265430 A1* | 8/2021 | Chang | H01L 27/3234 |
| 2022/0209148 A1* | 6/2022 | Park | B32B 9/045 |

OTHER PUBLICATIONS

Final Office Action dated Aug. 2, 2021 for U.S. Appl. No. 16/171,135, filed Oct. 25, 2018, 10 Pages.

International Preliminary Report on Patentability for International Application No. PCT/US2019/058128, dated May 6, 2021, 16 Pages.

International Search Report and Written Opinion for International Application No. PCT/US2019/058128, dated Apr. 3, 2020, 21 Pages.

Non-Final Office Action dated Aug. 2, 2022 for U.S. Appl. No. 16/521,908, filed Jul. 25, 2019, 18 pages.

Non-Final Office Action dated Feb. 10, 2021 for U.S. Appl. No. 16/171,135, filed Oct. 25, 2018, 10 pages.

Non-Final Office Action dated Mar. 13, 2019 for U.S. Appl. No. 16/006,734, filed Jun. 12, 2018, 13 pages.

Non-Final Office Action dated Apr. 14, 2020 for U.S. Appl. No. 16/557,838, filed Aug. 30, 2019, 18 pages.

Non-Final Office Action dated Feb. 18, 2021 for U.S. Appl. No. 16/785,258, filed Feb. 7, 2020, pages.

Non-Final Office Action dated Aug. 20, 2020 for U.S. Appl. No. 16/179,752, filed Nov. 2, 2018, 12 pages.

Notice of Allowance dated Jul. 10, 2019 for U.S. Appl. No. 16/006,734, filed Jun. 12, 2018, 5 pages.

Notice of Allowance dated Oct. 18, 2021 for U.S. Appl. No. 16/171,135, filed Oct. 25, 2018, 9 pages.

Notice of Allowance dated Feb. 26, 2021 for U.S. Appl. No. 16/179,752, filed Nov. 2, 2018, 8 pages.

Notice of Allowance dated Jul. 27, 2020 for U.S. Appl. No. 16/557,838, filed Aug. 30, 2019, 5 pages.

Notice of Allowance dated Oct. 28, 2020 for U.S. Appl. No. 16/530,678, filed Aug. 2, 2019, 10 pages.

Notice of Allowance dated Nov. 30, 2020 for U.S. Appl. No. 16/179,752, filed Nov. 2, 2018, 16 pages.

Restriction Requirement dated Oct. 1, 2020 for U.S. Appl. No. 16/171,135, filed Oct. 25, 2018, 7 Pages.

* cited by examiner

1100 Arrange a plurality of light emitters in a first emission region of a display panel. The plurality of light emitters in the first emission region is electrically coupled with a plurality of activation lines for the first emission region. A single activation line of the plurality of activation lines for the first emission region is electrically coupled with a first number of light emitters in the first emission region.

Arrange a plurality of light emitters in a second emission region of the display panel. The plurality of light emitters in the second emission region is electrically coupled with a plurality of activation lines for the second emission region. A single activation line of the plurality of activation lines for the second emission region is electrically coupled with a second number of light emitters in the second emission region. The second number is distinct from the first number.

1110 Attach a first sub-display panel that includes the plurality of light emitters for the first emission region to an interposer. The first emission region includes a matrix layout having a plurality of row activation lines and a plurality of column activation lines. The plurality of light emitters arranged in the second emission region is individually addressable.

1120 Attach a second sub-display panel that includes the plurality of light emitters for the second emission region to the interposer, the second sub-display panel being distinct and separate from the first sub-display panel.

Position a respective light emitter of the plurality of light emitters for the first emission region at a location adjacent to a respective intersection of a row activation line of the plurality of row activation lines and a column activation line of the plurality of column activation lines and electrically couple the respective light emitter with the row activation line and the column activation line.

Two or more light emitters of the plurality of light emitters for the first emission region are electrically coupled with a single row activation line of the plurality of row activation lines and two or more light emitters of the plurality of light emitters for the first emission region are electrically coupled with a single column activation line of the plurality of column activation lines.

A number of activation lines of the plurality of activation lines for the second emission region is equal to, or greater than, a number of light emitters of the plurality of light emitters arranged in the second emission region.

Figure 11

DISPLAY DEVICES AND METHODS OF MAKING THE SAME

This application is a continuation application of U.S. patent application Ser. No. 16/785,258, filed Feb. 7, 2020, which claims the benefit of, and priority to, U.S. Provisional Patent Application No. 62/804,108, filed Feb. 11, 2019, and is a continuation-in-part application of U.S. patent application Ser. No. 16/530,678, filed Aug. 2, 2019, now U.S. Pat. No. 10,921,499. U.S. patent application Ser. No. 16/530,678 claims the benefit of, and priority to, U.S. Provisional Patent Application Ser. No. 62/804,105, filed Feb. 11, 2019, and is a continuation-in-part application of U.S. patent application Ser. No. 16/006,734, filed Jun. 12, 2018, which is now U.S. Pat. No. 10,453,828. All of these applications are incorporated by reference herein in their entireties.

This application is also related to U.S. patent application Ser. No. 16/557,838, filed Aug. 30, 2019, now U.S. Pat. No. 10,854,583, which is a continuation application of U.S. patent application Ser. No. 16/006,734, filed Jun. 12, 2018, now U.S. Pat. No. 10,453,828, both of which are incorporated by reference herein in their entireties.

TECHNICAL FIELD

This relates generally to head-mounted display devices, and more specifically to optical components used in head-mounted display devices.

BACKGROUND

Head-mounted display devices (also called herein head-mounted displays) are gaining popularity as a means for providing visual information to users.

One or more display panels used in head-mounted display devices have a plurality of activation lines to address (or activate) a plurality of light emitters for multiple resolutions. However, the large number of activation lines coupled with the plurality of light emitters increases the complexity of display device fabrication. The highly complex structure of the display devices also creates additional expenses in manufacturing the display devices.

SUMMARY

Accordingly, there is a need for an addressing layout for head-mounted display devices to reduce the complexity of the display device fabrication.

The above deficiencies and other problems are reduced or eliminated by the disclosed devices, systems, and methods.

In accordance with some embodiments, a display device includes a display panel configured to project light, the display panel having a first emission region and a second emission region that is distinct from and mutually exclusive to the first emission region and that surrounds the first emission region. The display device further includes a first plurality of light emitters arranged in the first emission region and a plurality of activation lines for the first emission region. The display device further includes a second plurality of light emitters arranged in the second emission region and a plurality of activation lines for the second emission region. A single activation line of the plurality of activation lines for the first emission region is electrically coupled with a first number of light emitters in the first emission region. A single activation line of the plurality of activation lines for the second emission region is electrically coupled with a second number of light emitters in the second emission region. The second number is distinct from the first number.

In accordance with some embodiments, a method of making a display device includes arranging a first plurality of light emitters in a first emission region of a display panel and arranging a second plurality of light emitters in a second emission region of the display panel. The first plurality of light emitters arranged in the first emission region is electrically coupled with a plurality of activation lines for the first emission region and the second plurality of light emitters arranged in the second emission region is electrically coupled with a plurality of activation lines for the second emission region. A single activation line of the plurality of activation lines for the first emission region is electrically coupled with a first number of light emitters in the first emission region and a single activation line of the plurality of activation lines for the second emission region is electrically coupled with a second number of light emitters in the second emission region. The second number is distinct from the first number.

Thus, the disclosed embodiments provide devices and methods that reduce power consumption.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 11 is a flow diagram illustrating a method of making a display device in accordance with some embodiments.

Figure 1:
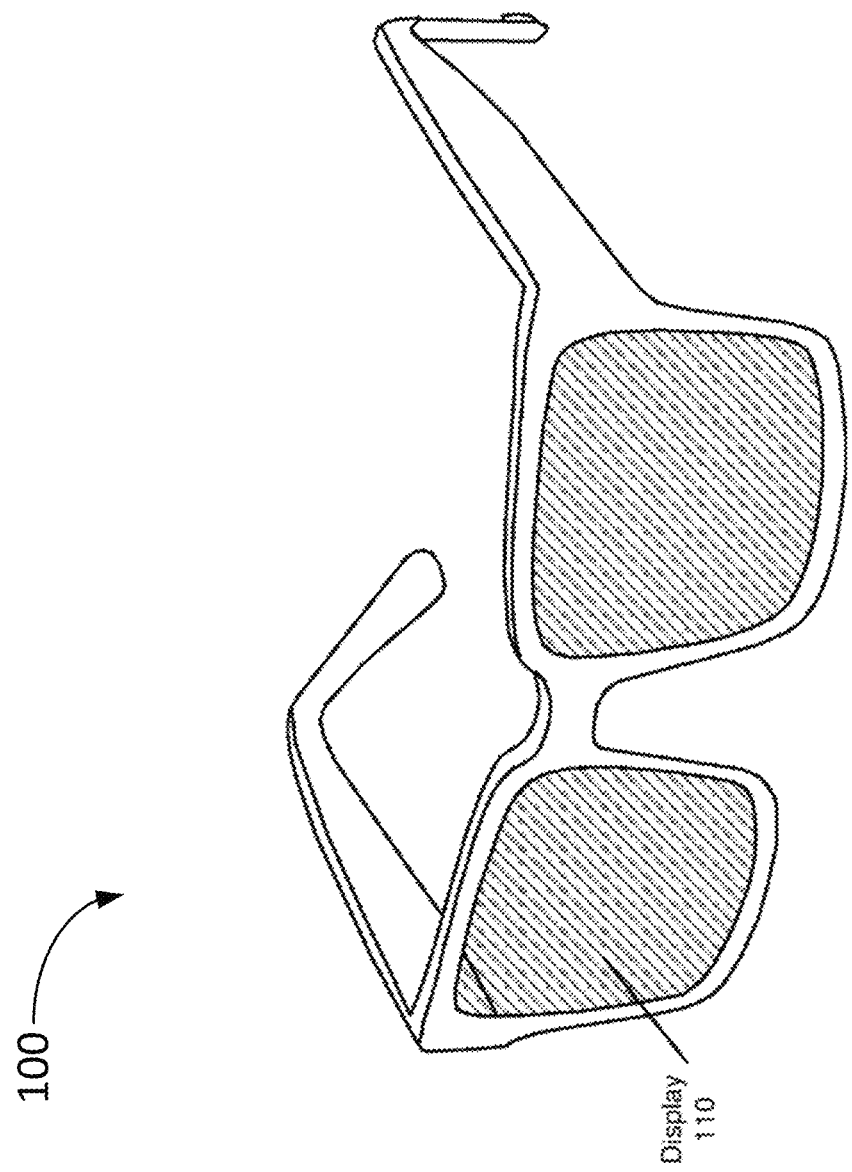
FIG. 1 is a perspective view of a display device in accordance with some embodiments.

These figures are not drawn to scale unless indicated otherwise.

DETAILED DESCRIPTION

Human eyes have a non-uniform resolution across a field of vision. For example, a human eye typically has a high resolution around a fovea of the eye, and the resolution rapidly decreases toward a peripheral area of a retina of the eye. To reduce the power consumption of head-mounted display devices, foveated displays with multiple emission regions of different densities (e.g., a high resolution region having a higher density of light emitters for foveal vision and a low resolution region having a lower density of light emitters for peripheral vision) are used.

To address the plurality of light emitters in the multiple resolution regions of the displays, a plurality of activation lines coupled with the plurality of light emitters is required. However, due to the relatively small size of the high resolution region and the high density of light emitters in the high resolution region, connecting the large number of activation lines to the plurality of light emitters in the multiple resolution regions increase the complexity of the display device fabrication.

This application discloses a hybrid addressing layout for reducing the complexity of the display device fabrication. In the hybrid addressing layout, a single activation line is configured to activate at least two light emitters in the high resolution region and a single activation line is configured to activate a single light emitter in the low resolution region. Thus, the hybrid addressing layout reduces the number of activation lines required to activate a plurality of light emitters and provide a simple configuration for the display device fabrication.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first region could be termed a second region, and, similarly, a second region could be termed a first region, without departing from the scope of the various described embodiments. The first region and the second region are both regions, but they are not the same region.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Embodiments described herein may include or be implemented in conjunction with an artificial reality system. Artificial reality is a form of reality that has been adjusted in some manner before presentation to a user, which may include, e.g., virtual reality (VR), augmented reality (AR), mixed reality (MR), hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality environment. An artificial reality system that provides artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on the head of a user or to be included as part of a helmet or headset, display device 100 maybe called a head-mounted display or headset. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual content (e.g., augmented reality content, virtual reality content, mixed reality content, or any combination thereof) to a user.

In some embodiments, display device 100 includes one or more components described below with respect to FIG. 2. In some embodiments, display device 100 includes additional components not shown in FIG. 2.

Figure 2:
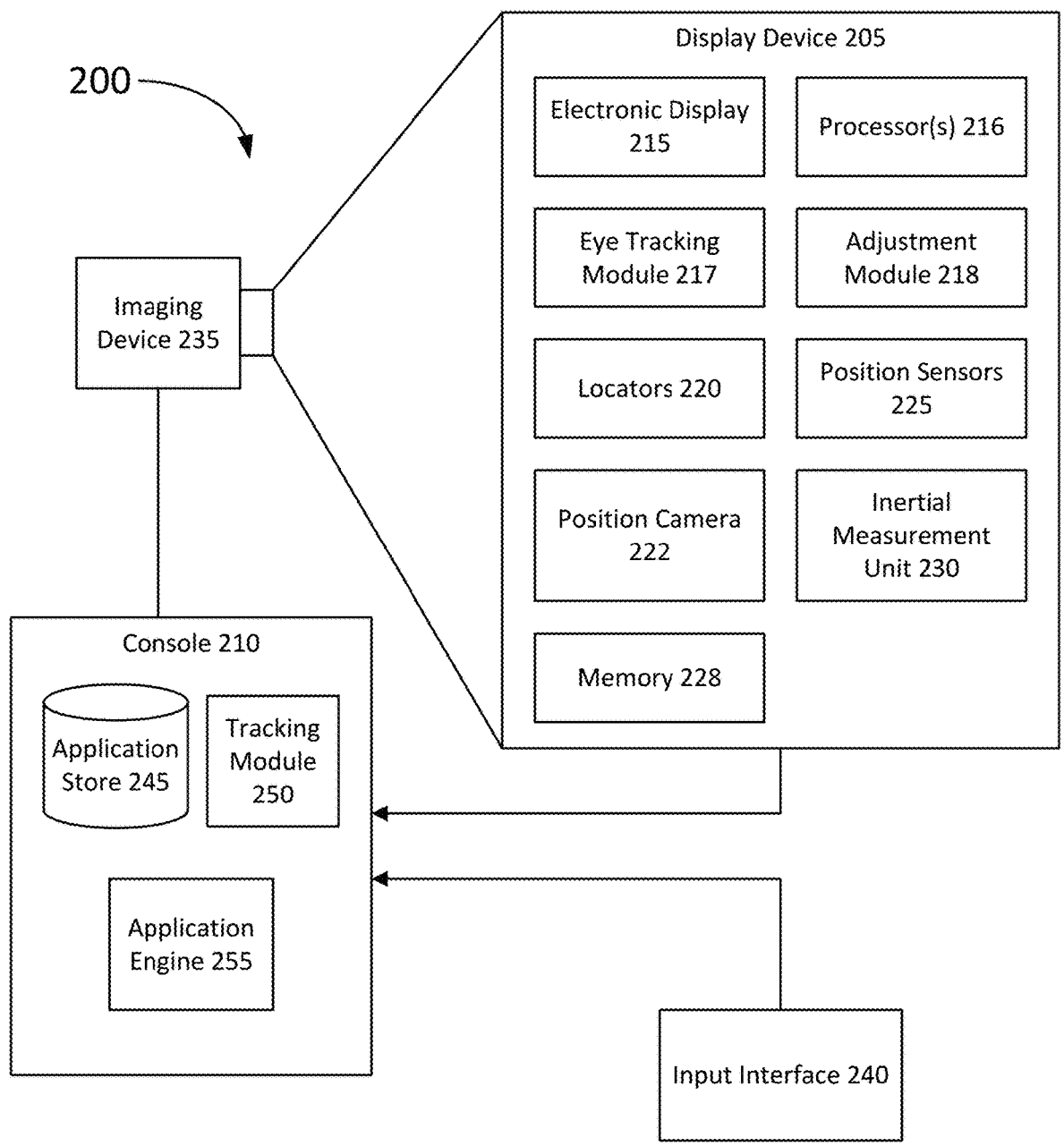
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having an associated input interface 240 and being monitored by one or more imaging devices 235, with each display device 205, input interface 240, and imaging device 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and/or augmented reality.

In some embodiments, as shown in FIG. 1, display device 205 is a head-mounted display that presents media to a user. Examples of media presented by display device 205 include one or more images, video, audio, haptics, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 can augment views of a physical, real-world environment with computer-generated elements (e.g., images, video, sound, haptics, etc.). Moreover, in some embodiments, display device 205 is able to cycle between different types of operation. Thus, display device 205 can operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM, or other solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user).

In some embodiments, the display element includes one or more light emission devices and a corresponding array of emission intensity arrays. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more lenses direct light from the arrays of light emission devices (optionally through the emission intensity arrays) to locations within each eyebox and ultimately to the back of the user's retina(s). An eyebox is a region that is occupied by an eye of a user located proximate to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye also is used to determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). Alternatively, the eye's gaze direction may be calculated using the known geometry of the system and the eye, by calibration of the system, or by machine learning techniques. As mentioned above, in some embodiments, system 200 may use other eye tracking systems than the embedded IR one described above.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display not to pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is optionally configured to detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
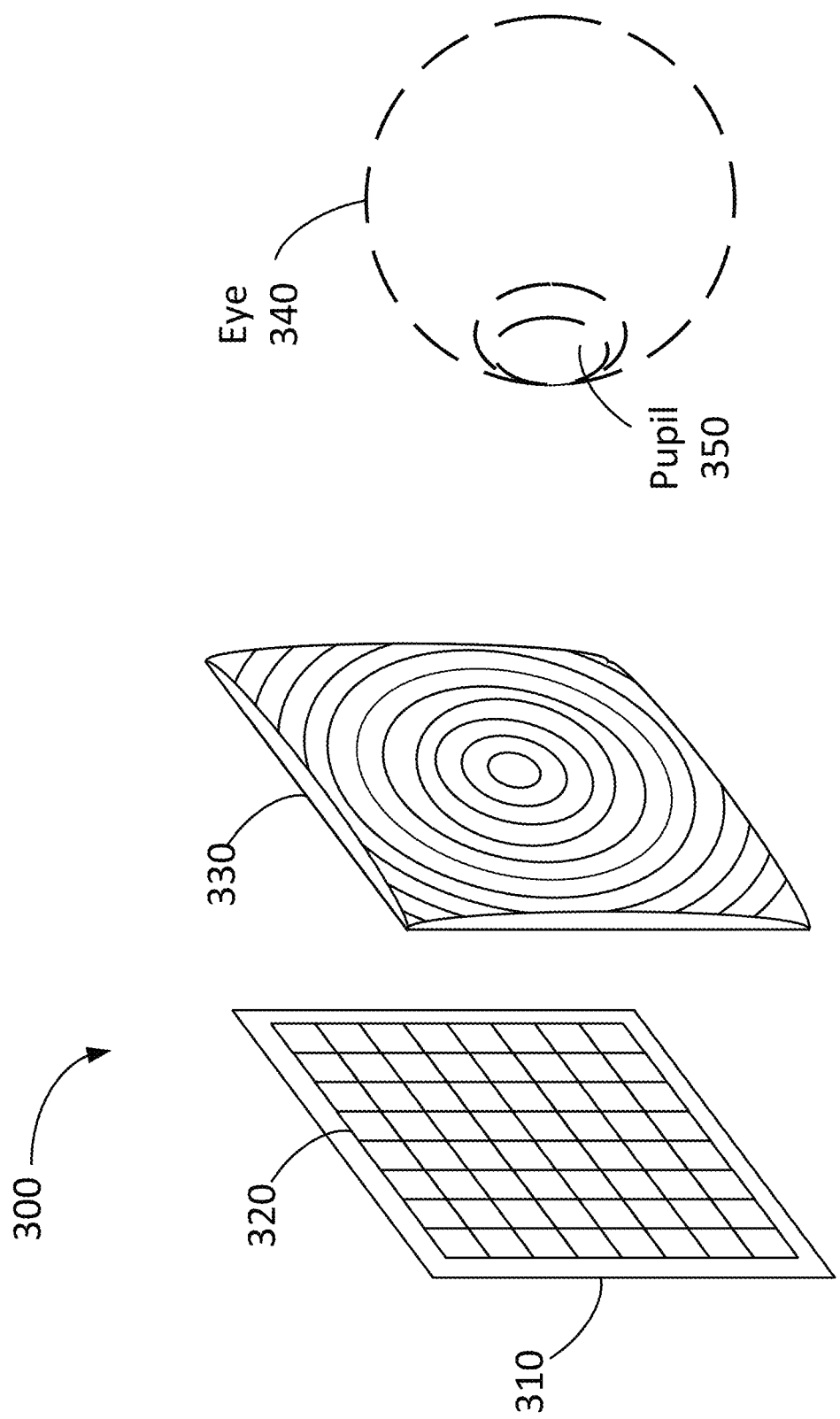
FIG. 3 is an isometric view of a display device in accordance with some embodiments.

FIG. 3 is an isometric view of display device 300 in accordance with some embodiments. In some other embodiments, display device 300 is part of some other electronic display (e.g., digital microscope, etc.). In some embodiments, display device 300 includes light emission device array 310 and one or more lenses 330. In some embodiments, display device 300 also includes an emission intensity array and an IR detector array.

Light emission device array 310 emits image light and optional IR light toward the viewing user. Light emission device array 310 may be, e.g., an array of LEDs, an array of microLEDs, an array of OLEDs, or some combination thereof. Light emission device array 310 includes light emission devices 320 that emit visible light (and optionally includes devices that emit IR light). In some embodiments, a microLED includes an LED with an emission area characterized by a representative dimension (e.g., a diameter, a width, a height, etc.) of 100 µm or less (e.g., 50 µm, 20 µm, etc.). In some embodiments, a microLED has an emission area having a shape of a circle, a square, or a rectangle.

The emission intensity array is configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner the emission intensity array is able to control what portion of the image light emitted from light emission device array 310 is passed to the one or more lenses 330. In some embodiments, display device 300 uses the emission intensity array to facilitate providing image light to a location of pupil 350 of eye 340 of a user, and minimize the amount of image light provided to other areas in the eyebox.

One or more lenses 330 receive the modified image light (e.g., attenuated light) from the emission intensity array (or directly from emission device array 310), shifted by one or more beam shifters 360, and direct the shifted image light to a location of pupil 350.

An optional IR detector array detects IR light that has been retro-reflected from the retina of eye 340, the cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and the emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

A significant portion of power used for operating a head-mounted display device is used for (i) computation needed to render high-resolution images and (ii) conversion of electrical energy to light for displaying the rendered images. Human eyes have a non-uniform resolution across a field of vision. For example, a human eye typically has a higher resolution around a fovea of the eye, and with resolution decreasing toward a peripheral area of the retina of the eye. To reduce the power consumption of head-mounted display devices, displays with multiple regions of different densities can be used. A high resolution region is used for providing a higher resolution image to the fovea of the eye, and a low resolution region is used for providing a lower resolution image to the peripheral area of the retina of the eye (which, however, does not impact the perceived resolution, as the peripheral area of the retina of the eye has a low resolution). The low resolution region consumes less power than the high resolution region for a same unit area.

Figure 4:
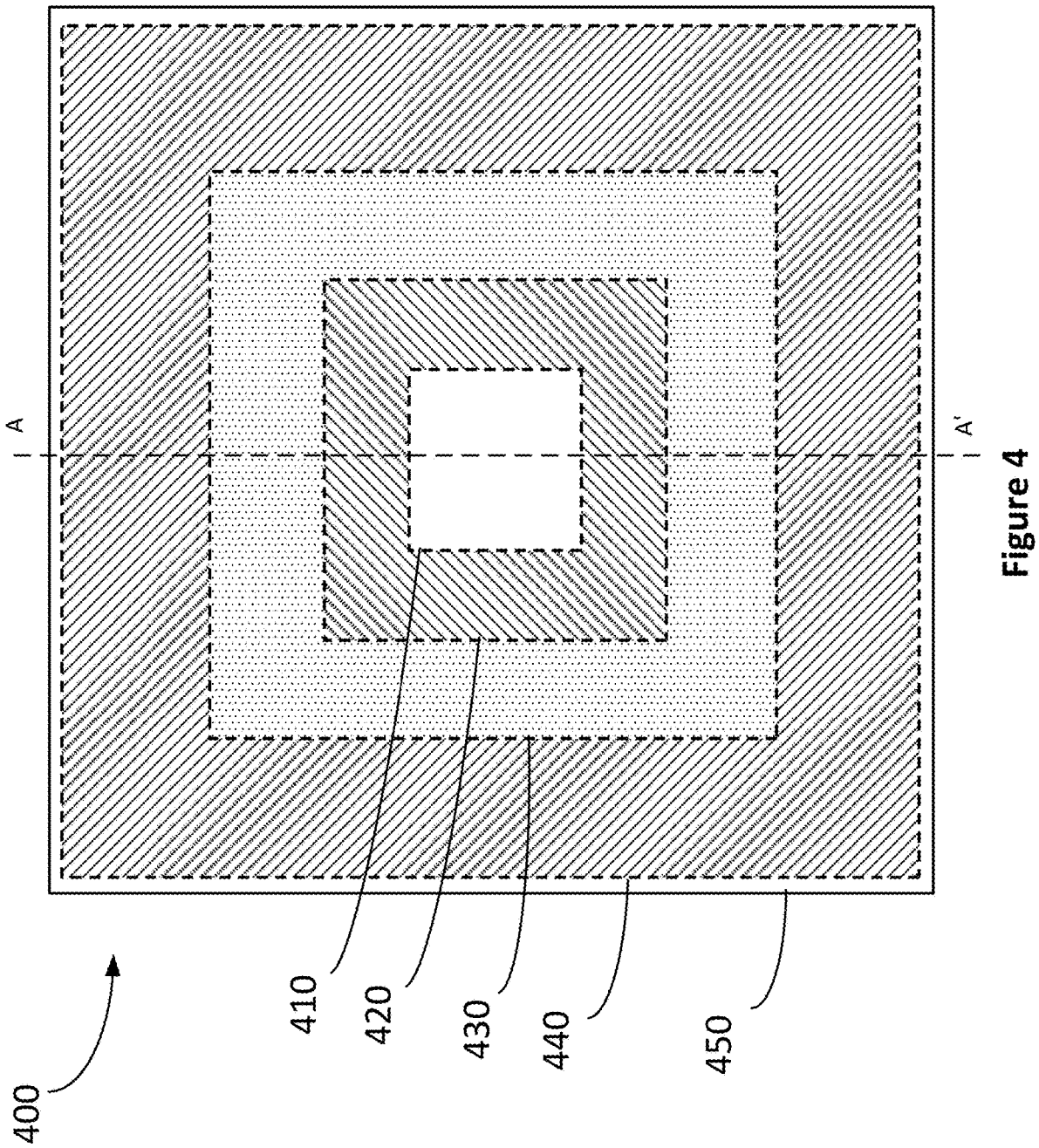
FIG. 4 illustrates a display panel in accordance with some embodiments.

FIG. 4 illustrates a display panel 400 in accordance with some embodiments.

In some embodiments, the display panel 400 corresponds to the light emission device array 310 shown in FIG. 3. In some embodiments, the display panel 400 is coupled with a circuit board 450. The display panel 400 includes a first emission region 410, a second emission region 420, a third emission region 430, and a fourth emission region 440. Although FIG. 4 illustrates the display panel 400 having four emission regions, the display panel 400 is not limited to having four emission regions, but rather may have fewer or more emission regions (e.g., at least 2, 3, 5, 6, or 7 regions, etc.).

In some cases, the first emission region 410 is configured to provide light to a fovea of a user's eye and the other emission regions (e.g., the second emission region 420, the third emission region 430, and the fourth emission region 440) is configured to provide light to a peripheral-vision area of the user's eye. The second emission region 420 is distinct from and mutually exclusive to the first emission region 410 and the third emission region 430 is distinct from and mutually exclusive to the second emission region 420. The fourth emission region 440 is distinct from and mutually exclusive to the third emission region 430. Each of these emission regions are distinct from each other.

In FIG. 4, the first emission region 410 is surrounded by the second emission region 420, the second emission region 420 is surrounded by the third emission region 430 and the third emission region 430 is surrounded by the fourth emission region 440.

In some embodiments, the first emission region 410 is no more than 50% of the total area of the display panel 400. In other embodiments, it can be less than 20%, less than 10%, and, or less than 5% of the area of the display panel 400.

In some embodiments, the second emission region 420 is in contact with the first emission region 410, and the third emission region 430 is in contact with the second emission region 420. In some embodiments, the fourth emission region 440 is in contact with the third emission region 430.

In some embodiments, the third emission region 430 is distinct and separate from the first emission region 410. In some embodiments, the fourth emission region 440 is distinct and separate from the first emission region 410 and the second emission region 420. In some embodiments, each of theses emission regions can be distinct from each other.

In some embodiments, the display panel 400 includes a plurality of light emitters arranged in the first emission region 410, the second emission region 420, the third emission region 430, and the fourth emission region 440 (e.g., multiple light emitters are arranged in the first emission region 410, multiple light emitters are arranged in the second emission region 420, multiple light emitters are arranged in the third emission region 430, and multiple light emitters are arranged in the fourth emission region 440).

In some embodiments, the plurality of light emitters is individually addressable. In some embodiments, the light emitters are arranged in a respective emission region in an array (e.g., a rectangular array, a honeycomb array, etc.). In order to provide different resolutions in different emission regions, each emission region has a different density of light emitters. In some embodiments, the first emission region 410 has a first density of light emitters, the second emission region 420 has a second density of light emitters that is less than the first density, and the third emission region 430 has a third density of light emitters that is less than the second density. In some embodiments, the fourth emission region 440 has a fourth density of light emitters that is less than the third density.

In some embodiments, the first density is at least 50% higher than the second density. In some embodiments, the first density is at least 75% higher than the second density. In some embodiments, the first density is at least 100% higher than the second density.

In some embodiments, the second density is at least 50% higher than the third density. In some embodiments, the second density is at least 75% higher than the third density. In some embodiments, the second density is at least 100% higher than the third density.

In some embodiments, the third density is at least 50% higher than the fourth density. In some embodiments, the third density is at least 75% higher than the fourth density. In some embodiments, the third density is at least 100% higher than the fourth density.

In some embodiments, for any pair of emission regions selected from the plurality of emission regions in the display panel, an inner emission region of the pair of emission regions has a density of light emitters that is higher than a density of light emitters of an outer emission region of the pair of emission regions, the inner emission region being surrounded by the outer emission region.

In some embodiments, a ratio of the first density to the fourth density is at least 1.5:1, at least 2:1, at least 5:1, or at least 10:1. In some embodiments, a ratio of the first density to the third density is at least 1.5:1, at least 2:1, at least 5:1, or at least 10:1.

In some embodiments, a resolution of the display panel 400 decreases gradually from at least one emission region of the display panel to another. For example, in some cases, the first density of the first emission region 410 has the highest resolution among the plurality of emission regions, the second density of the second emission region 420 is at least 80%, 90%, or 95% of the first density, and the third density of the third emission region 430 is at least 80%, 90%, or 95% of the second density. In some embodiments, the fourth density of the fourth emission region 440 is at least 80%, 90%, or 95% of the third density.

In some embodiments, the display panel 400 includes ten or more emission regions, for any pair of adjacent emission regions selected from the ten or more emission regions, an outer emission region of the pair of adjacent emission regions has a density of light emitters that is at least 80%, 90%, or 95% of a density of light emitters of an inner emission region of the pair of adjacent emission regions. In some embodiments, the densities of the emission regions are selected so that boundaries of the emission regions are not visually perceivable (e.g., a ratio of densities of two adjacent emission regions is less than a predefined threshold).

Figure 5:
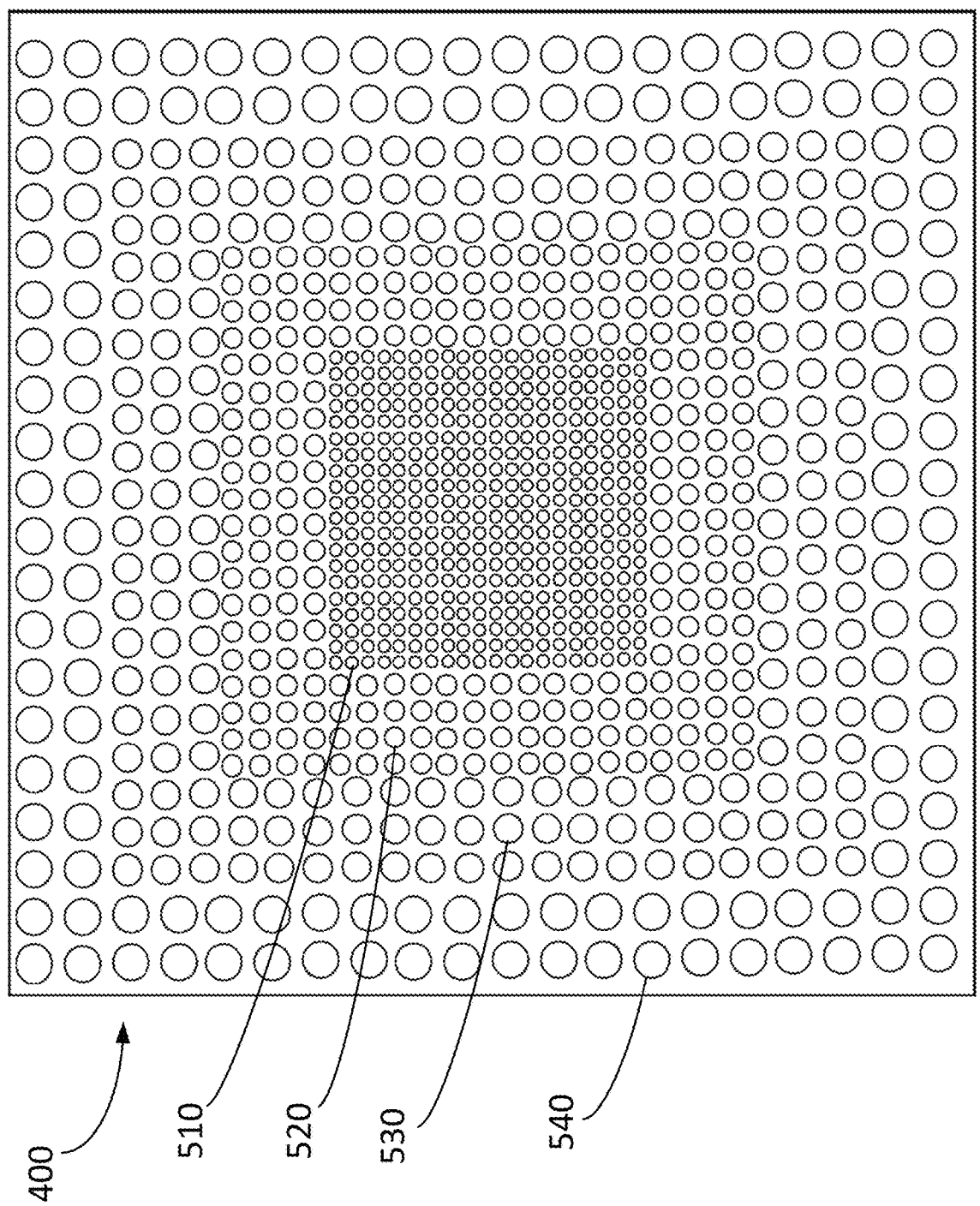
FIG. 5 illustrates a plurality of light emitters located in a plurality of emission regions of a display panel in accordance with some embodiments.

FIG. 5 illustrates a plurality of light emitters located in a plurality of emission regions in a display panel (e.g., the display panel 400 shown in FIG. 4) in accordance with some embodiments.

As shown in FIG. 5, light emitters are arranged with a different density in each of the first, second, third, and fourth emission regions of the display panel 400. Light emitters 510 are arranged in the first emission region, light emitters 520 are arranged in the second emission region, and light emitters 530 are arranged in the third emission region. Light emitters 540 are arranged in the fourth emission region.

As shown in FIG. 5, in some embodiments, a light emitter 510 in the first emission region is smaller than a light emitter 520 in the second emission region, a light emitter 530 in the third emission region, and a light emitter 540 in the fourth emission region. In some embodiments, the light emitter 520 in the second emission region is smaller than the light emitter 530 in the third emission region and the light emitter 540 in the fourth emission region. In some embodiments, the light emitter 530 in the third emission region is smaller than the light emitter 540 in the fourth emission region.

In some embodiments, each of the plurality of emitters has a same emission area.

In some embodiments, an emission area of an emitter increases with the reduction in a density of the plurality of emission regions, thereby maintaining a perceived brightness uniformly across the field of view. In some embodiments, for any pair of emission regions in the display panel 400, a light emitter in the inner emission region of the pair of emission regions has an emission area that is smaller than an emission area of a light emitter in the outer emission region surrounding the inner region while the inner emission region has a higher density than the outer emission region. For example, as shown in FIG. 5, in some embodiments, the first emission region has a higher density than the second emission region, and the light emitter 510 in the first emission region have an emission area that is less than an emission area of the light emitter 520 in the second emission region. In some embodiments, the emission area of the light emitter 520 in the second emission region is less than an emission area of the light emitter 530 in the third emission region. In some embodiments, the emission area of the light emitter 530 in the third emission region is less than an emission area of the light emitter 540 in the fourth emission region. In some embodiments, the emission area of the light emitter 510 in the first emission region is less than 50%, 20%, 10%, or 5% of the emission area of the light emitter 540 in the fourth emission region. In some embodiments, the emission area of the light emitter 510 in the first emission region is less than 50%, 20%, 10%, or 5% of the emission area of the light emitter 530 in the third emission region.

The plurality of light emitters in accordance with some embodiments is based on organic light-emitting diodes (OLEDs), light-emitting diodes (LEDs), superluminescent LEDs (SLEDs), LD, vertical cavity surface emitting lasers (VCSELs), or any combination thereof. The display device in accordance with some embodiments is monochromatic, or has two, three (e.g. RGB), or four colors (e.g. RGBY or RGBW), or more. In some embodiments, the display device is a combination of color emitters with IR emitters. In some embodiments, the display device is a combination of color emitters with IR emitters. In some embodiments, a respective light emitter of the plurality of light emitters includes a first sub-pixel corresponding to a first color (e.g., red) and a second sub-pixel, that is distinct from the first sub-pixel, corresponding to a second color (e.g., blue) that is distinct from the first color. In some embodiments, the respective light emitter includes a third sub-pixel, that is distinct from the first sub-pixel and the second sub-pixel, corresponding to a third color (e.g., green) that is distinct from the first color and the second color.

As described above, in some embodiments, each emission region has a different density of light emitters. A box 600 illustrated in FIG. 5 indicates a portion of the display panel 400 that is shown in detail in FIG. 6.

Figure 6:
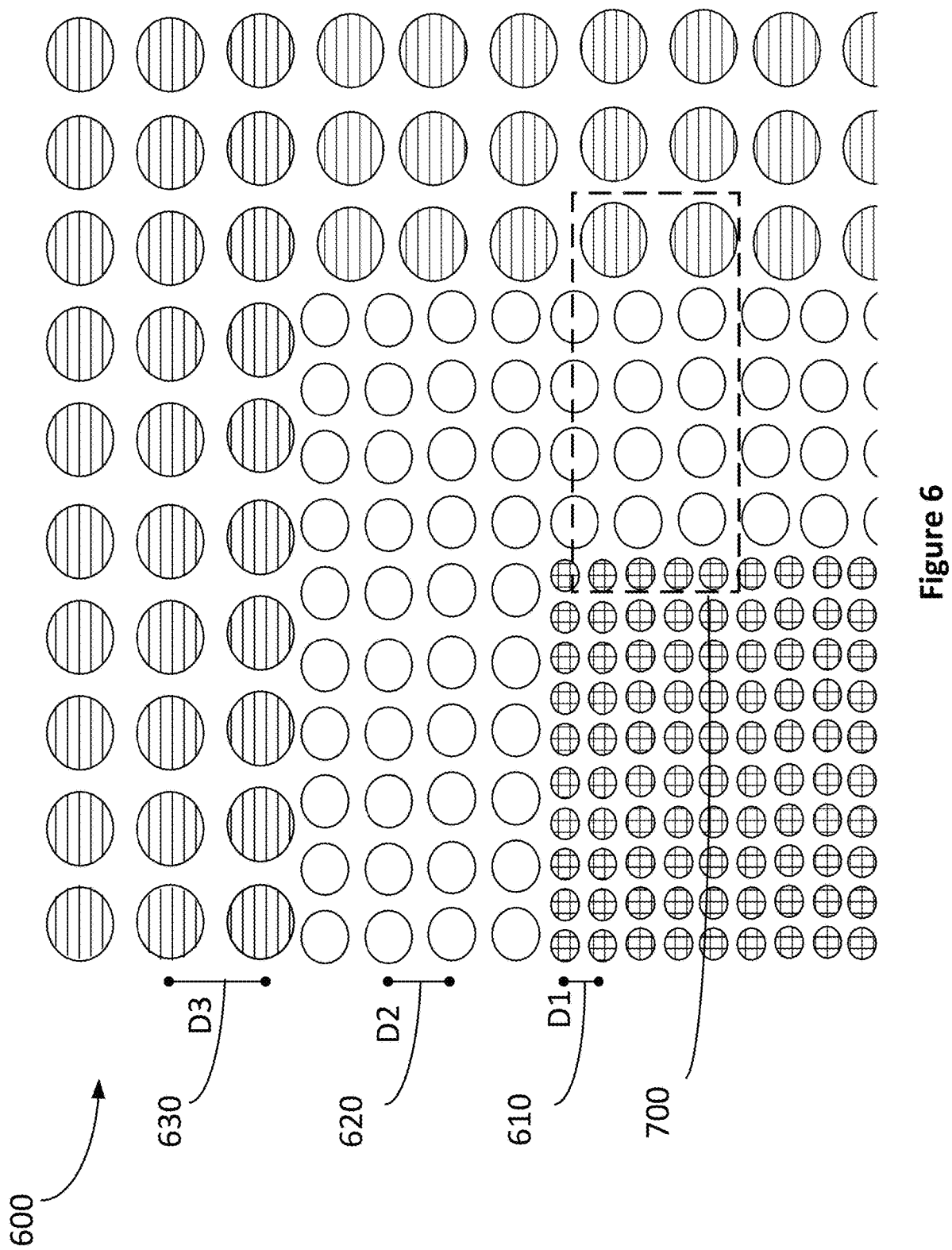
FIG. 6 illustrates an enlarged view of a portion of the display panel shown in FIG. 5 in accordance with some embodiments.

FIG. 6 illustrates an enlarged view of a portion 600 of the display panel 400 shown in FIG. 5 in accordance with some embodiments. The portion 600 shows different densities of light emitters in the first emission region, the second emission region, and the third emission region in accordance with some embodiments.

In FIG. 6, the portion 600 of the display panel 400 includes a portion of the first emission region, a portion of the second emission region, and a portion of the third emission region. For illustration purposes, in FIG. 6, light emitters in the first emission region, the second emission region, and the third emission region are filled with different hatching patterns (e.g., the light emitters in the first emission region are cross-hatched, the light emitters in the second emission region are not hatched, and the light emitters in the third emission region are horizontally hatched).

In some embodiments, a density of light emitters in an emission region is determined from a distance between adjacent (e.g., neighboring) light emitters in the emission region. In some cases, a center-to-center spacing between the adjacent light emitters is deemed to be the distance between the adjacent light emitters. In some cases, an average center-to-center spacing between adjacent light emitters in a particular emission region is deemed to be the distance between the adjacent light emitters. In some cases, an edge-to-edge spacing between the adjacent light emitters is deemed to be the distance between the adjacent light emitters. As shown in FIG. 6, two light emitters, that are adjacent to each other, in the first emission region are spaced apart by a first distance 610 (e.g., a first distance D1) and two light emitters, that are adjacent to each other, in the second emission region are spaced apart by a second distance 620 (e.g., a second distance D2) that is greater than the first distance 610. Two light emitters, that are adjacent to each other, in the third emission region are spaced apart by a third distance 630 (e.g., a third distance D3) that is greater than the second distance 620. As shown in FIG. 6, the first emission region has a higher density of light emitters than the second emission region, and the second emission region has a higher density of light emitters than the third emission region.

Figure 7:
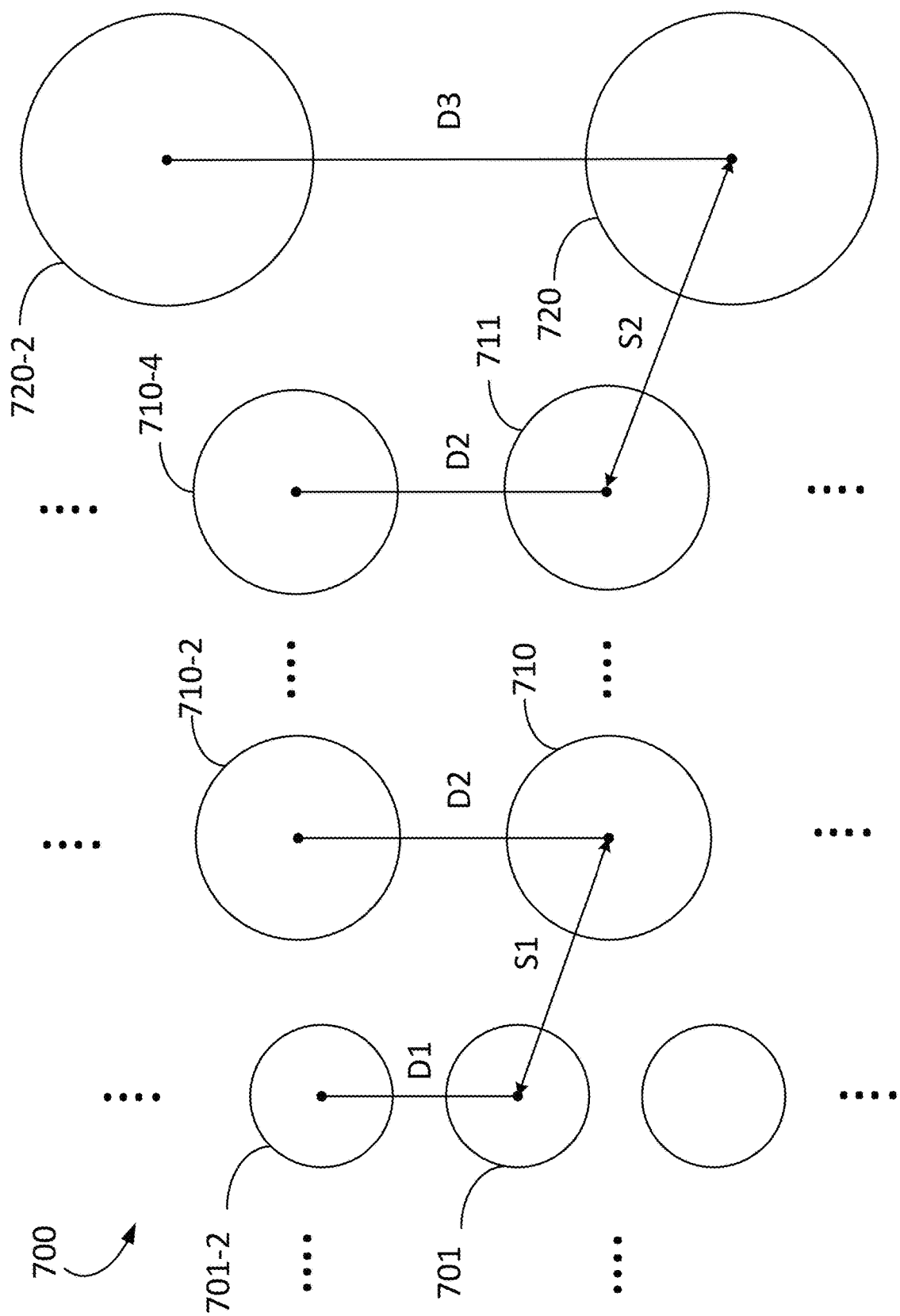
FIG. 7 illustrates an enlarged view of a portion of the display panel shown in FIG. 5 in accordance with some embodiments.

A box 700 illustrated in FIG. 6 indicates a portion of the display panel 400 that is shown in detail in FIG. 7.

FIG. 7 illustrates an enlarged view of a portion 700 of the display panel 400 shown in FIG. 5 in accordance with some embodiments. The portion 700 shows a distance between adjacent light emitters in the first emission region, a distance between adjacent light emitters in the second emission region, and a distance between adjacent light emitters in the third emission region.

In FIG. 7, the first emission region includes a light emitter 701-1 that is adjacent to a neighboring light emitter 701-2 in the first emission region. The light emitter 701-1 is located adjacent to the second emission region (e.g., the light emitter 701-1 is located adjacent to a border between the first emission region and the second emission region) and, in particular, to a light emitter 710-1 in the second emission region. The light emitter 710-1 is located adjacent to the first emission region (e.g., the light emitter 710-1 is located adjacent to the border between the first emission region and the second emission region) and, in particular, to the light emitter 701-1.

The display panel also includes a light emitter 710-3 that is adjacent to a neighboring light emitter 710-4 in the second emission region. The light emitter 710-3 is located adjacent to the third emission region (e.g., the light emitter 710-3 is located adjacent to a border between the second emission region and the third emission region) and, in particular, to a light emitter 720-1 in the third emission region. The light emitter 720-1 is located adjacent to the second emission region (e.g., the light emitter 720-1 is located adjacent to the border between the second emission region and the third emission region) and, in particular, to the light emitter 710-3.

In FIG. 7, the light emitter 701-1 is spaced apart from the neighboring light emitter 701-2 in the first emission region by the first distance D1 and the second light emitter 710-1 is spaced apart from the neighboring light emitter 710-2 in the second emission region by the second distance D2. The light emitter 701-1 is spaced apart from the light emitter 710-1 by a distance S1. In some embodiments, the distance S1 is at most the second distance D2 (e.g., the distance S1 is equal to, or less than, the second distance D2).

In FIG. 7, the light emitter 710-3 is spaced apart from the neighboring light emitter 710-4 in the second emission region by the second distance D2 and the light emitter 720-1 is spaced apart from the neighboring light emitter 720-2 in the third emission region by the third distance D3. The light emitter 710-3 is spaced apart from the light emitter 720-1 by a distance S2. In some embodiments, the distance S2 is at most the third distance D3 (e.g., the distance S2 is equal to, or less than, the third distance D3).

In FIG. 7, some light emitters in each emission region are omitted so as not to obscure other aspects of these emission regions and light emitters located therein.

As described herein, the display panel (e.g., the display panel 400) includes a plurality of light emitters in a plurality of emission regions (e.g., the first emission region 410, the second emission region 420, the third emission region 430, the fourth emission region 440, etc.). A plurality of activation lines coupled with the plurality of light emitters is used to individually address (or activate) the plurality of light emitters in the plurality of emission regions. However, a high resolution region (e.g., the first emission region 410) is relatively smaller than low resolution regions (e.g., the second emission region 420, etc.) and has a higher density of light emitters (e.g., determined from a distance 610). Due to the relatively small size of the high resolution region and the higher density of the light emitters, connecting the large number of activation lines to the plurality for light emitters increases complexity of the display device fabrication.

To reduce the complexity of the display device fabrication, a hybrid addressing layout, that is a combination of a matrix layout for the high resolution region and direct addressing for the low resolution region, is used. For example, in the high resolution region (e.g., the first emission region 410), a plurality of light emitters is arranged in a plurality of row activation lines and a plurality of column activation lines of the matrix layout. A single activation (row or column) line of the matrix layout is coupled with two or more light emitters of the plurality of light emitters so that the number of activation lines required to activate the plurality of light emitters is reduced. In the lower resolution region (e.g., the second emission region 420), at least one activation line of the plurality of activation lines for the lower resolution region is coupled with a single light emitter of the plurality of light emitters so that the display panel is able to individually activate that emitter and provide a faster response to a peripheral vision.

Figure 8:
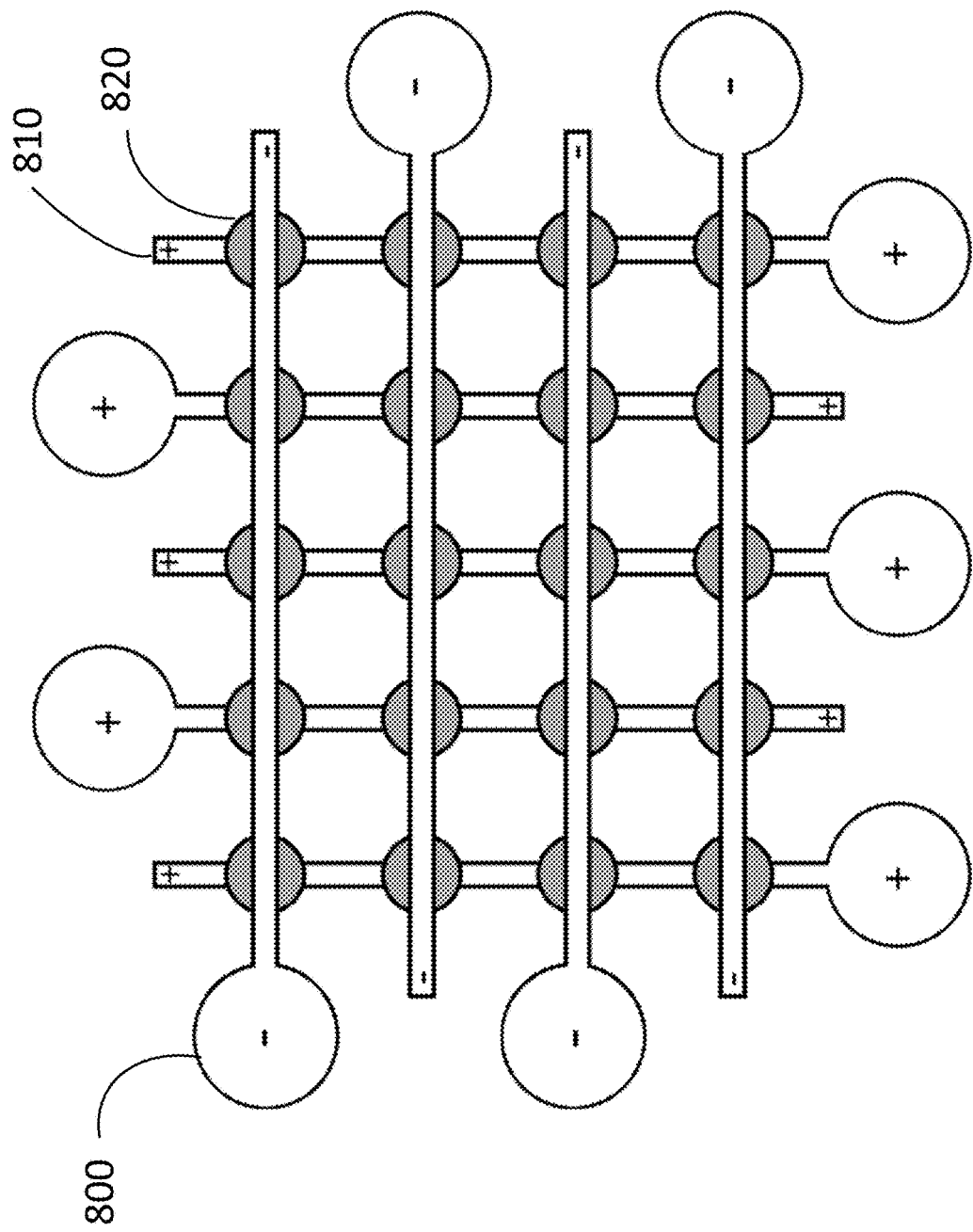
FIG. 8 illustrates a matrix layout for a high resolution region of a display panel in accordance with some embodiments.

FIG. 8 illustrates a matrix layout for a high resolution region of a display panel in accordance with some embodiments.

In some embodiments, a high resolution region (e.g., the first emission region 410) of the display panel (e.g., the display panel 400) includes a M by N matrix layout having a plurality of row activation lines and a plurality of column activation lines for activating a plurality of light emitters in the high resolution region. In some embodiments, M represents the number of row activation lines of the plurality of row activation lines and N represents the number of column activation lines of the plurality of column activation lines. M and N are determined by the number of light emitters of the plurality of light emitters in the higher resolution region. In the matrix layout, a single row activation line is coupled with two or more light emitters of the plurality of light emitters and a single column activation line is coupled with two or more light emitters of the plurality of light emitters. A respective light emitter of the plurality of light emitters is positioned at a location adjacent to a respective intersection of a row activation line of the plurality of row activation lines and a column activation line of the plurality of column activation lines. Therefore, the number of light emitters of the plurality of light emitters is equal to the number of intersections of M row activation lines and N column activation lines (M times N). In addition, the respective light emitter is electrically coupled with the row activation line and the column activation line so that the plurality of light emitters in the higher resolution region is activated by M+N activation lines instead of M×N activation lines. In some embodiments, M is equal to, or distinct from N (e.g., M=4 and N=4, M=5 and N=4, M=4 and N=5, etc.). In some embodiments, the number of light emitter of the plurality of light emitters is more than two (e.g., ten, twenty, hundred, thousand, etc.) as shown in FIG. 5.

FIG. 8 illustrates a 4 by 5 matrix layout having 4 row activation lines and 5 column activation lines for 20 light emitters in the high resolution region. In some embodiments, as shown in FIG. 8, 4 row activation lines are cathodes (e.g., a row activation line 800) and 5 column activation lines are anodes (e.g., a column activation line 810). As shown in FIG. 8, 5 light emitters are electrically coupled with the row activation line 800 and 4 light emitters are electrically coupled with the column activation line 810. In some embodiments, a light emitter 820 is positioned at a location adjacent to an intersection of the row activation line 800 and the column activation line 810 so that the light emitter 820 is electrically coupled with the row activation line 800 and the column activation line 810. In this manner, the display device is able to activate 20 light emitters by using only 9 activation lines of the matrix layout, that is equal to a sum of 4 row activation lines and 5 column activation lines. In some embodiments, the plurality of light emitters for the high resolution region is included in a display panel that is distinct and separate from a display panel having a plurality of light emitters for the low resolution region. The display panel for the higher resolution region is relatively smaller than the display panel for the lower resolution region so that the display panel for the higher resolution region is separately fabricated as a single piece and attached to the display panel for the lower resolution region.

Figure 9:
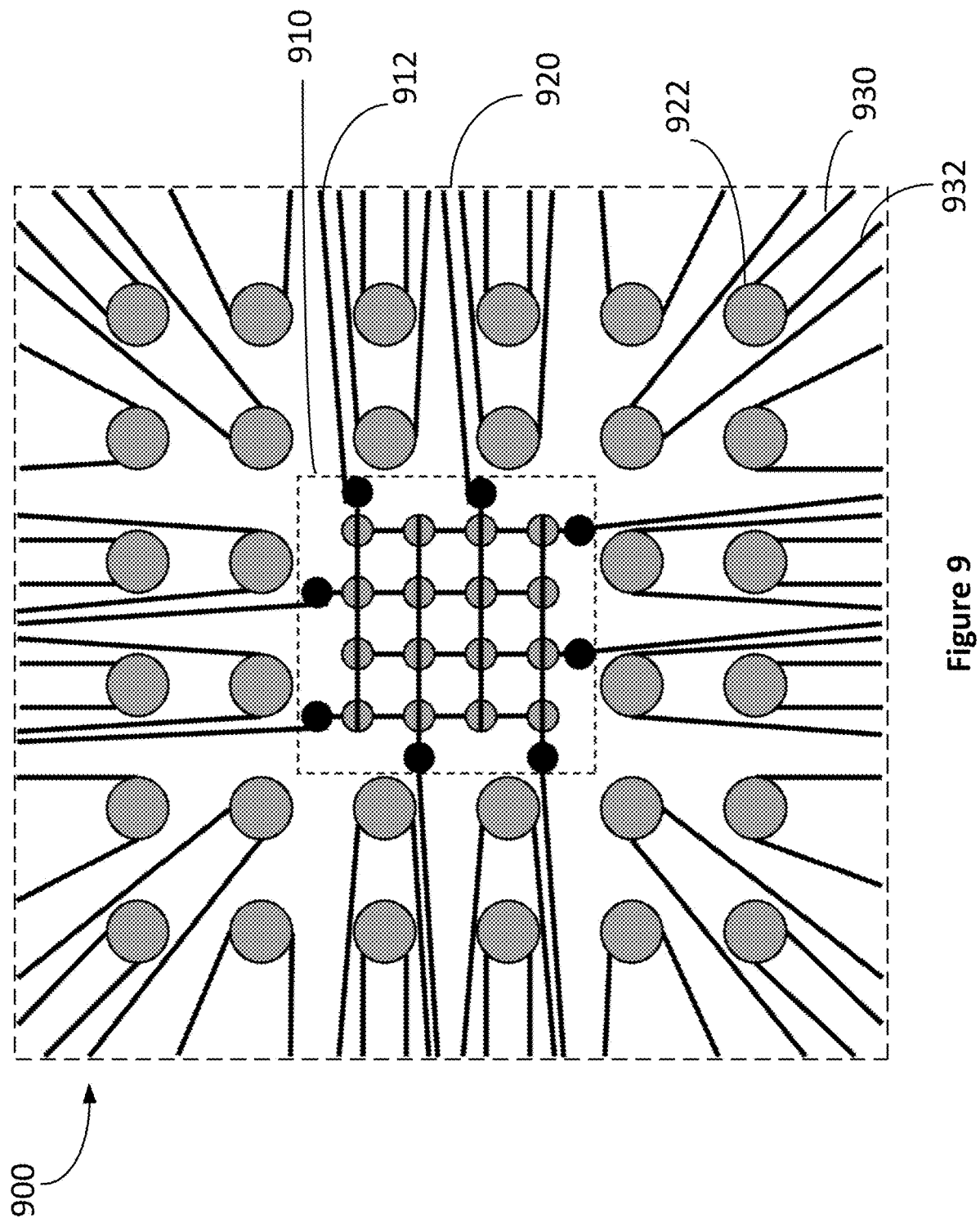
FIG. 9 illustrates a hybrid addressing layout for a display panel in accordance with some embodiments.

FIG. 9 illustrates a hybrid addressing layout for a display panel in accordance with some embodiments.

In some embodiments, the higher resolution region is referred to as a first emission region (e.g., the first emission region 410) and the lower resolution region is referred to as a second emission region (e.g., the second emission region 420). In the hybrid addressing layout, a M by N matrix having M+N activation lines is used for a first plurality of light emitters arranged in the first emission region as described with respect to FIG. 8 while a plurality of activation lines is used for a second plurality of light emitters arranged in the second emission region. In some embodiments, a single activation line for the first emission region is coupled with a first number of light emitters in the first emission region and a single activation line for the second emission region is coupled with a second number of light emitters in the second emission region. In some embodiments, the first number of light emitters is distinct from the second number of light emitters (e.g., the first number of light emitters is 3, the second number of light emitters is 1). In some embodiments, the first number of light emitters is same as the second number of light emitters. In some embodiments, the first number of light emitters in the first emission region has one value when M is equal to N. For example, in a 4 by 4 matrix having 4 row activation lines and 4 column activation lines for 16 light emitters in the high resolution region, a single row activation line is coupled with 4 light emitters and a single column activation line is coupled with 4 light emitters. The first number of light emitters is 4. In some embodiments, the first number of light emitters in the first emission region has two values when M is distinct from N (e.g., M=3, N=4 or M=6, N=4, etc.). For example, in a 4 by 5 matrix having 4 row activation lines and 5 column activation lines for 20 light emitters in the higher resolution region, a single row activation line is coupled with 5 light emitters and a single column activation line is coupled with 5 light emitters so that the first number is 4 or 5. In some embodiments, the second plurality of light emitters in the second emission region is coupled with a plurality of activation lines so that the second plurality of light emitters in the second emission region is individually addressable. In some embodiments, the number of activation lines of the plurality of activation lines for the second emission region is equal to, or greater than the number of light emitters of the second plurality of light emitters in the second emission region. For example, a single light emitter in the second emission region is coupled with a single activation line so that the second number of light emitters coupled with a single activation line is 1. For example, a single light emitter in the second emission region coupled with two activation lines, the second number of light emitters is 2.

FIG. 9 illustrates the first emission region 910 (e.g., the first emission region 410) having a 4 by 4 matrix layout for 16 light emitters in the first emission region 910 and the second emission region 920 (e.g., the second emission region 420) having 64 connection lines coupled with 32 light emitters in the second emission region 920. Although FIG. 9 illustrates the first emission region 910 and the second emission region 920, the display panel 900 may have more than two emission regions (e.g., at least 3, 4, 5, 6 or 7 regions, etc.). As shown in FIG. 9, the 4 by 4 matrix layout for the first emission region 910 has 8 activation lines 912 including 4 row activation lines and 4 column activation lines. A single row activation line is coupled with 4 light emitters and a single column activation line is coupled with 4 light emitters. Therefore, the number of light emitters coupled with any single activation line of the 8 activation lines for the first emission region 910 is 4. As shown in FIG. 9, a single light emitter 922 in the second emission region 920 is coupled with two activation lines 930, 932. In this manner, the display device is able to activate 32 light emitters in the second emission region 920 by using 64 activation lines. Therefore, the number of activation lines for the second emission region 920 coupled with any single light emitter is 2, which is distinct from 4 light emitters coupled with the single activation line for the first emission region 910.

Figure 10:
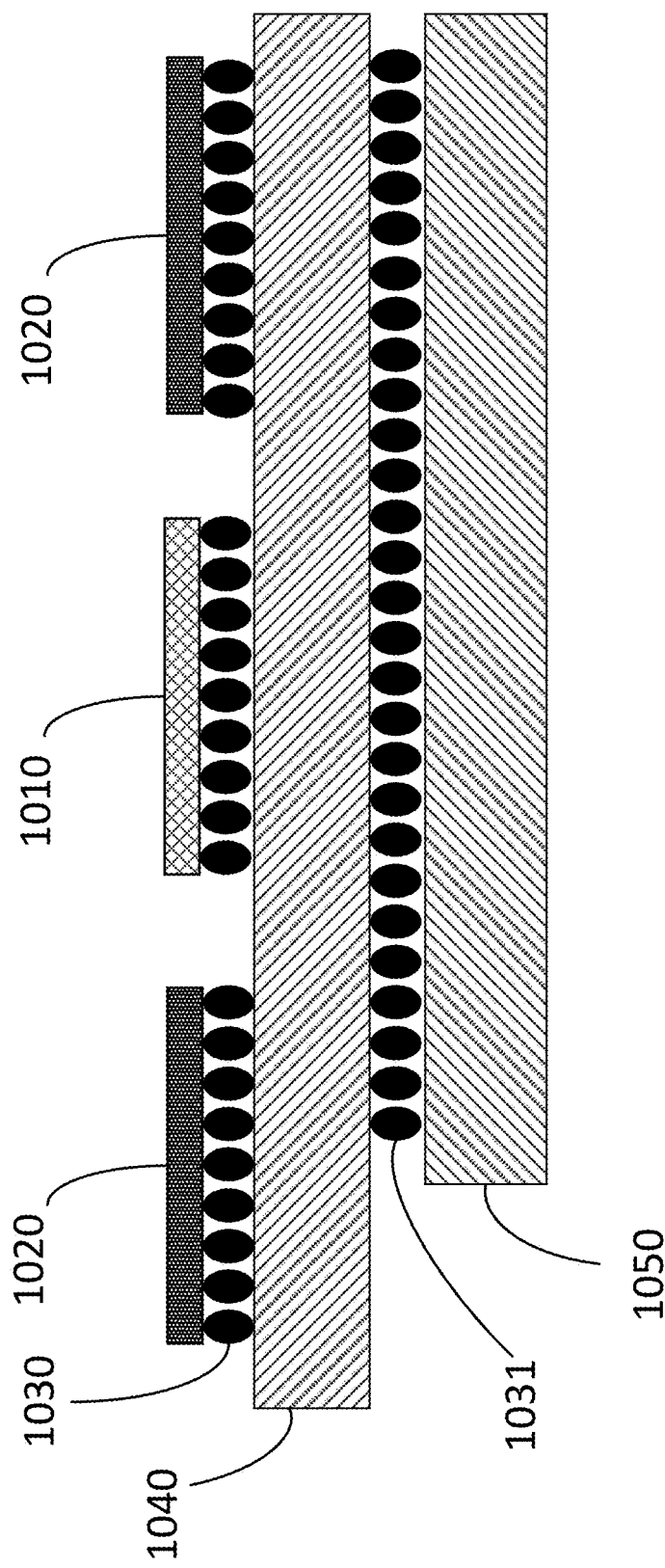
FIG. 10 illustrates a cross-sectional view of a display panel having an interposer that is coupled with a control circuit.

FIG. 10 illustrates a cross-sectional view of a display panel having an interposer that is coupled with a control circuit. Line AA' in FIG. 4 represents a view from which the cross-sectional shown in FIG. 10 is taken.

In some embodiments, a display panel (e.g., the display panel 400) has a plurality of sub-display panels including a first sub-display panel 1010 and two sub-display panels 1020 stacked on an interposer 1040 that is coupled with a control circuit 1050. The plurality of sub-display panels is vertically connected to the control circuit 1050 through the interposer 1040. In some embodiments, the plurality of sub-display panels is distinct and separate from each other. In some embodiments, a first emission region (e.g., the first emission region 910) of the display panel (e.g., the display panel 400) is included in the first sub-display panel 1010 that is fabricated as a single piece using the matrix layout as described with respect to FIGS. 8-9. In some embodiments, a second emission region (e.g., the second emission region 920) is included in at least two sub-display panels (e.g., two sub-display panels 1020) that include a plurality of light emitters coupled with a plurality of activation lines as described with respect to FIGS. 8-9. In some embodiments, at least two adjacent sub-display panels are connected to each other to form the second emission region that surround the first emission region. In some embodiments, the two sub-display panels 1020 are separately fabricated and distinct from each other. As described with respect to FIGS. 4-5, the display panel has a few more emission regions (e.g., 3,4,5,6,7, etc.), and a single emission region of the emission regions is included in at least one sub-display panel in order to form the display structure illustrated in FIG. 5. The plurality of sub-display panels may have different sizes. In some embodiments, a plurality of solder bumps 1030 is disposed on an upper surface of the interposer so that the plurality of sub-display panels can be attached to the upper surface of the interposer 1040 through the plurality of solder bumps 1030.

In some embodiments, the control circuit 1050, which is configured to control (or drive) the plurality of sub-display panels, is attached to a lower surface of the interposer 1040. In some embodiments, the control circuit 1050 is a single ASIC (Application-Specific Integrated Circuit) to maintain a constant pitch used for bonding row drivers and column drivers that are configured to drive at least one sub-display panel. In some embodiments, the control circuit 1050 is smaller than the display panel having the plurality of sub-display panels. In this configuration, the control circuit 1050 is positioned below the first sub-display panel 1010 thereby driving the first sub-display panel for a high resolution at higher speed than other sub-display panels for low resolutions. In some embodiments, the control circuit 1050 is positioned below the first sub-display panel 1010 and at least one sub-display panel (e.g., the sub-display panel 1020) for a portion of the second emission region (e.g., the second emission region 920). The control circuit 1050 is attached to the lower surface of the interposer 1040 through a plurality of solder bumps 1031 disposed on the lower surface of the interposer 1040. The number of solder bumps of the plurality of sold bumps 1031 disposed on the lower surface of the interposer 1040 is less than the number of solder bumps of the plurality of solder bumps 1030 disposed on the upper surface of the interposer 1040.

In some embodiments, the interposer 1040 has a plurality of TSVs (Through Silicon Vias, not illustrated in FIG. 10) that is configured to connect at least one solder bump of the plurality of solder bumps 1030 disposed on the upper surface of the interposer 1040 and at least one solder bump of the plurality of solder bumps 1031 disposed on the lower surface of the interposer 1040. In some embodiments, the interposer 1040 includes a plurality of sub-interposers, that corresponds to the plurality of sub-display panels for different resolutions, that is distinct from each other. For example, the interposer 1040 can include a first sub-interposer that is positioned below the first sub-display panel 1010 for the first emission region (e.g., the first emission region 410, the first emission region 910). The interposer 1040 can further include a second sub-interposer that is positioned below one of two sub-display panels 1020 forming a portion of the second emission region (e.g., the second emission region 420, the second emission region 920). In some embodiments, the plurality of sub-interposers have different heights. As described with respect to FIGS. 5-7, a light emitter (e.g., the light emitter 510) in a higher resolution region (e.g., the first emission region 410, the first emission region 910) is smaller than a light emitter (e.g., the light emitter 520, or the light emitter 530) in lower resolution region(s) (e.g., the second emission region 420, the third emission region 430). In some embodiments, the first sub-interposer has a height that is greater than a height of sub-interposers for the lower resolution region(s) to elevate a plurality of light emitters in the higher resolution region.

FIG. 11 is a flow diagram illustrating a method of making a display device in accordance with some embodiments.

The method includes arranging (1100) a first plurality of light emitters in a first emission region (e.g., the first emission region 410, the first emission region 910) of a display panel (e.g., the display panel 400 in FIGS. 4-5, the display panel 900 in FIG. 9) and arranging a second plurality of light emitters in a second emission region (e.g., the second emission region 420 or the second emission region 920) of the display panel. The first plurality of light emitters in the first emission region (e.g., the first emission region 410 or the first emission region 910) are electrically coupled with a plurality of activation lines for the first emission region as described with respect to FIGS. 8-9. A single activation line of the plurality of activation lines (e.g., the single row activation line or the single column activation line illustrated in FIG. 9) for the first emission region is electrically coupled with a first number of light emitters (e.g., 4 light emitters illustrated in FIG. 9) in the first emission region as described with respect to FIGS. 8-9. The second plurality of light emitters in the second emission region (e.g., the second emission region 420, the second emission region 920) are electrically coupled with a plurality of activation lines for the second emission region (e.g., 64 activation lines illustrated in FIG. 9). A single activation line of the plurality of activation lines for the second emission region is electrically coupled with a second number of light emitters (e.g., 2 light emitters illustrated in FIG. 9) in the second emission region. The second number is distinct from the first number as described with respect to FIGS. 8-9.

The method further includes attaching (1110) a first sub-display panel (e.g., the first sub-display panel 1010) that includes the first plurality of light emitters arranged in the first emission region to an interposer (e.g., the interposer 1040). In some embodiments, the first emission region (e.g., the first emission region 910) includes a matrix layout having a plurality of row activation lines and a plurality of column activation lines as described with respect to FIGS. 8-9. In some embodiments, the second plurality of light emitters arranged in the second emission region (e.g., the second emission region 920) are individually addressable as described with respect to FIGS. 8-9.

The method further includes attaching (1120) a second sub-display panel (e.g., a sub-display panel 1020) that includes the second plurality of light emitters arranged in the second emission region (e.g., the second emission region 920) to the interposer (e.g., the interposer 1040). In some embodiments, the second sub-display panel is distinct and separate from the first sub-display panel as described with respect to FIGS. 8-10.

The method further includes positioning (1120) a respective light emitter (e.g., the light emitter 820) of the first plurality of light emitters arranged in the first emission region (e.g., the first emission region 410, the first emission region 910) at a location adjacent to a respective intersection of a row activation line (e.g., the row activation line 800) of the plurality of row activation lines and a column activation line (e.g., the column activation line 810) of the plurality of column activation lines. The method further includes electrically coupling (1120) the respective light emitter with the row activation line and the column activation line as described with respect to FIGS. 8-9. In some embodiments, two or more light emitters of the first plurality of light emitters arranged in the first emission region are electrically coupled with a single row activation line of the plurality of row activation lines and two or more light emitters of the first plurality of light emitters arranged in the first emission region are electrically coupled with a single column activation line of the plurality of column activation lines as described with respect to FIGS. 8-9. In some embodiments, a number of activation lines of the plurality of activation lines for the second emission region is equal to, or greater than, a number of light emitters of the second plurality of light emitters arranged in the second emission region as described with respect to FIGS. 8-9.

In light of these principles, we turn to certain embodiments.

In accordance with some embodiments, a display device includes a display panel configured to project light that has a first emission region, a second emission region that is distinct from and mutually exclusive to the first emission region and that surrounds the first emission region (e.g., FIGS. 4-7). The display device further includes a first plurality of light emitters arranged in the first emission region, and a plurality of activation lines for the first emission region (e.g., FIGS. 4-9). A single activation line of the plurality of activation lines for the first emission region is electrically coupled with a first number of light emitters in the first emission region (e.g., FIGS. 8-9). The display device further includes a second plurality of light emitters arranged in the second emission region and a plurality of activation lines for the second emission region (e.g., FIGS. 8-9). A single activation line of the plurality of activation lines for the second emission region is electrically coupled with a second number of light emitters in the second emission region (e.g., FIGS. 8-9). The second number is distinct from the first number (e.g., FIGS. 8-9).

In some embodiments, the display panel includes an interposer and the first plurality of light emitters arranged in the first emission region is included in a first sub-display panel that is attached to the interposer (e.g., FIGS. 8-10).

In some embodiments, the second plurality of light emitters arranged in the second emission region is included in a second sub-display panel that is attached to the interposer. The second sub-display panel is distinct and separate from the first sub-display panel (e.g., FIG. 10).

In some embodiments, the first emission region includes a matrix layout having a plurality of row activation lines and a plurality of column activation lines (e.g., FIGS. 8-9).

In some embodiments, a respective light emitter of the first plurality of light emitters arranged the first emission region is positioned at a location adjacent to a respective intersection of a row activation line of the plurality of row activation lines and a column activation line of the plurality of column activation lines. The respective light emitter is electrically coupled with the row activation line and the column activation line (e.g., FIGS. 8-9).

In some embodiments, a sum of a number of row activation lines of the plurality of row activation lines and a number of column activation lines of the plurality of column activation lines is less than a number of light emitters of the first plurality of light emitters arranged in the first emission region (e.g., FIGS. 8-9).

In some embodiments, two or more light emitters of the first plurality of light emitters arranged in the first emission region are electrically coupled with a single row activation line of the plurality of row activation lines and two or more light emitters of the first plurality of light emitters arranged in the first emission region are electrically coupled with a single column activation line of the plurality of column activation lines (e.g., FIGS. 8-9).

In some embodiments, the second plurality of light emitters arranged in the second emission region is individually addressable (e.g., FIG. 9). A number of activation lines of the plurality of activation lines for the second emission region is equal to, or greater than, a number of light emitters of the second plurality of light emitters arranged in the second emission region (e.g., FIG. 9).

In some embodiments, the first emission region has a first density of the first plurality of light emitters arranged in the first emission region and the second emission region has a second density of the second plurality of light emitters arranged in the second emission region that is less than the first density (e.g., FIGS. 4-9). A light emitter arranged in the first emission region is smaller than a light emitter arranged in the second emission region (e.g., FIGS. 4-7).

In some embodiments, the display device further includes a controller coupled with the display panel that is configured to activate at least one light emitter in the first emission region using the plurality of activation lines for the first emission region and at least one light emitter in the second emission region using the plurality of activation lines for the second emission region (e.g., FIG. 10).

In accordance with some embodiments, a method of making a display device includes arranging a first plurality of light emitters in a first emission region of a display panel and arranging a second plurality of light emitters in a second emission region of the display panel (e.g., FIGS. 8-9). The first plurality of light emitters arranged in the first emission region is electrically coupled with a plurality of activation lines for the first emission region and the second plurality of light emitters arranged in the second emission region is electrically coupled with a plurality of activation lines for the second emission region (e.g., FIGS. 8-9). A single activation line of the plurality of activation lines for the first emission region is electrically coupled with a first number of light emitters in the first emission region (e.g., FIGS. 8-9). A single activation line of the plurality of activation lines for the second emission region is electrically coupled with a second number of light emitters in the second emission region and the second number is distinct from the first number (e.g., FIGS. 8-9).

In some embodiments, arranging the first plurality of light emitters in the first emission region of the display panel includes attaching a first sub-display panel that includes the first plurality of light emitters arranged in the first emission region to an interposer (e.g., FIGS. 8-10).

In some embodiments, the method further includes arranging the second plurality of light emitters in the second emission region of the display panel includes attaching a second sub-display panel that includes the second plurality of light emitters arranged in the second emission region to the interposer. The second sub-display panel is distinct and separate from the first sub-display panel (e.g., FIG. 10).

In some embodiments, the first emission region includes a matrix layout having a plurality of row activation lines and a plurality of column activation lines (e.g., FIGS. 8-9).

In some embodiments, the method further includes positioning a respective light emitter of the first plurality of light emitters arranged in the first emission region at a location adjacent to a respective intersection of a row activation line of the plurality of row activation lines and a column activation line of the plurality of column activation lines. The method further includes electrically coupling the respective light emitter with the row activation line and the column activation line (e.g., FIGS. 8-9).

In some embodiments, two or more light emitters of the first plurality of light emitters arranged in the first emission region are electrically coupled with a single row activation line of the plurality of row activation lines and two or more light emitters of the first plurality of light emitters arranged in the first emission region are electrically coupled with a single column activation line of the plurality of column activation lines (e.g., FIGS. 8-9).

In some embodiments, the second plurality of light emitters arranged in the second emission region is individually addressable (e.g., FIG. 9). A number of activation lines of the plurality of activation lines for the second emission region is equal to, or greater than, a number of light emitters of the second plurality of light emitters arranged in the second emission region (e.g., FIG. 9).

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:
1. A display device, comprising:
   a display panel for projecting light, the display panel having:
   a first emission region including:
      a first plurality of light emitters; and
      a first plurality of activation lines arranged in a plurality of row activation lines and a plurality of column activation lines, a respective activation line of the first plurality of activation lines being coupled with two or more light emitters of the first plurality of light emitters; and
   a second emission region that is distinct from and mutually exclusive to the first emission region and positioned adjacent to the first emission region, the second emission region including:
      a second plurality of light emitters; and
      a second plurality of activation lines, a respective activation line of the second plurality of activation lines being coupled with a single light emitter of the second plurality of light emitters.

2. The display device of claim 1, wherein:
the display panel includes an interposer; and
the first plurality of light emitters arranged in the first emission region is included in a first sub-display panel that is attached to the interposer.

3. The display device of claim 2, wherein the second plurality of light emitters arranged in the second emission region is included in a second sub-display panel that is attached to the interposer, the second sub-display panel being distinct and separate from the first sub-display panel.

4. The display device of claim 1, wherein the first plurality of activation lines includes a plurality of row activation lines and a plurality of column activation lines.

5. The display device of claim 4, wherein a respective light emitter of the first plurality of light emitters arranged in the first emission region is positioned at a location adjacent to a respective intersection of a row activation line of the plurality of row activation lines and a column activation line of the plurality of column activation lines, the respective light emitter being electrically coupled with the row activation line and the column activation line.

6. The display device of claim 4, wherein a sum of a number of row activation lines of the plurality of row activation lines and a number of column activation lines of the plurality of column activation lines is less than a number of light emitters of the first plurality of light emitters arranged in the first emission region.

7. The display device of claim 4, wherein two or more light emitters of the first plurality of light emitters arranged in the first emission region are electrically coupled with a single row activation line of the plurality of row activation lines and two or more light emitters of the first plurality of light emitters arranged in the first emission region are electrically coupled with a single column activation line of the plurality of column activation lines.

8. The display device of claim 1, wherein the second plurality of light emitters arranged in the second emission region is individually addressable.

9. The display device of claim 8, wherein a number of activation lines of the plurality of activation lines for the second emission region is equal to, or greater than, a number of light emitters of the second plurality of light emitters arranged in the second emission region.

10. The display device of claim 1, wherein:
the first emission region has a first density of the first plurality of light emitters arranged in the first emission region; and
the second emission region has a second density of the second plurality of light emitters arranged in the second emission region that is less than the first density.

11. The display device of claim 1, wherein a light emitter arranged in the first emission region is smaller than a light emitter arranged in the second emission region.

12. The display device of claim 1, further comprising:
a controller coupled with the display panel that is configured to activate at least one light emitter in the first emission region using the first plurality of activation lines for the first emission region and at least one light emitter in the second emission region using the second plurality of activation lines for the second emission region.

13. A method of making a display device, the method comprising:
arranging a first plurality of light emitters in a first emission region of a display panel, wherein the first plurality of light emitters in the first emission region is electrically coupled with a first plurality of activation lines in the first emission region, a respective activation line of the first plurality of activation lines for the first emission region being coupled with two or more light emitters of the first plurality of light emitters; and
arranging a second plurality of light emitters in a second emission region of the display panel, wherein the second plurality of light emitters in the second emission region is electrically coupled with a second plurality of activation lines in the second emission region, a respective activation line of the second plurality of activation lines for the second emission region being coupled with a single light emitter of the second plurality of light emitters.

14. The method of claim 13, wherein:
arranging the first plurality of light emitters in the first emission region of the display panel includes attaching a first sub-display panel, that includes the first plurality of light emitters arranged in the first emission region, to an interposer.

15. The method of claim 14, wherein:
arranging the second plurality of light emitters in the second emission region of the display panel includes attaching a second sub-display panel that includes the second plurality of light emitters arranged in the second emission region to the interposer, the second sub-display panel being distinct and separate from the first sub-display panel.

16. The method of claim 13, wherein the first plurality of activation lines includes a plurality of row activation lines and a plurality of column activation lines.

17. The method of claim 16, including positioning a respective light emitter of the first plurality of light emitters arranged in the first emission region at a location adjacent to a respective intersection of a row activation line of the plurality of row activation lines and a column activation line of the plurality of column activation lines and electrically coupling the respective light emitter with the row activation line and the column activation line.

18. The method of claim 16, wherein two or more light emitters of the first plurality of light emitters arranged in the first emission region are electrically coupled with a single row activation line of the plurality of row activation lines and two or more light emitters of the first plurality of light emitters arranged in the first emission region are electrically coupled with a single column activation line of the plurality of column activation lines.

19. The method of claim 13, wherein the second plurality of light emitters arranged in the second emission region is individually addressable.

20. The method of claim 19, wherein each activation line of the second plurality of activation lines for the second emission region is electrically coupled with only a single light emitter of the second plurality of light emitters arranged in the second emission region.

* * * * *